United States Patent [19]
Krauss

[11] Patent Number: 5,872,482
[45] Date of Patent: Feb. 16, 1999

[54] AMPLIFIER CIRCUIT HAVING A PAIR OF DIFFERENTIAL TRANSISTORS WITH DIFFERING THRESHOLD VALUES FOR PERFORM OFFSET COMPENSATION

[75] Inventor: Mathias Krauss, Ammerbuch, Germany

[73] Assignee: Zentrum Mikroelektronik Dresden GmbH, Dresden, Germany

[21] Appl. No.: 673,997

[22] Filed: Jul. 1, 1996

[30] Foreign Application Priority Data

Jul. 27, 1995 [DE] Germany .......................... 195 27 384.2

[51] Int. Cl.[6] ...................................................... G06G 7/12
[52] U.S. Cl. ............................ 327/561; 327/67; 327/562; 330/253; 330/293
[58] Field of Search .................................. 327/63, 65, 67, 327/68, 72, 561, 562, 563; 330/252, 253, 259, 260, 261, 271, 278, 291, 293

[56] References Cited

U.S. PATENT DOCUMENTS

| | | | |
|---|---|---|---|
| 4,195,239 | 3/1980 | Suzuki | 327/52 |
| 4,464,588 | 8/1984 | Wieser | 327/543 |
| 4,952,821 | 8/1990 | Kokubun | 327/74 |
| 5,159,260 | 10/1992 | Yoh et al. | 327/530 |
| 5,252,868 | 10/1993 | Miida et al. | 327/277 |
| 5,557,234 | 9/1996 | Collins | 327/563 |

OTHER PUBLICATIONS

IEEE Journal of Solid–State Circuits, vol. SC–13, No. 6, Dec. 1978, "A New NMOS Temperature–Stable Voltage Reference", by Robert A. Blauschild et al.

*Primary Examiner*—Kenneth B. Wells
*Attorney, Agent, or Firm*—Jordan and Hamburg

[57] ABSTRACT

An amplifier circuit for analog-signal processing has an operational amplifier having an output, an inverting input, and supply inputs for accepting a single supply potential and a reference potential. The operational amplifier has a non-inverting input capable of accepting a signal voltage of a varying analog signal input thereto which has a positive value range and a negative value range relative to the reference potential. The output is fed back to the inverting input and the operational amplifier has a differential amplifier having first and second field-effect transistors. The first field-effect transistor has a gate connected to the noninverting input of the operational amplifier and the second field-effect transistor has a gate connected to the inverting input. The first field-effect transistor has a threshold voltage lower than a threshold voltage of the second field-effect transistor by an amount at least equal to an amount of a value range of the analog signal voltage outside a range defined by the single supply potential and the reference potential to offset an output signal at the output to within the range defined by the single supply potential and the reference potential.

11 Claims, 1 Drawing Sheet

AMPLIFIER CIRCUIT HAVING A PAIR OF DIFFERENTIAL TRANSISTORS WITH DIFFERING THRESHOLD VALUES FOR PERFORM OFFSET COMPENSATION

BACKGROUND OF THE INVENTION

The invention relates to a circuit for signal processing, for which a signal voltage, representing the signal, can assume a positive or negative value range or a value range of equal value relative to a reference potential, the circuit including an operational amplifier on the input side, the output of which is fed back to the inverting input and the noninverting input of which represents the input for the signal voltage, a differential amplifier, located between the inverting and the noninverting inputs, being formed by field-effect transistors, and a circuit for supplying the operational amplifier with an operating voltage.

As a rule, analog signals are voltages, which are bipolar with respect to a reference potential. Within a circuit system, ground potential (0 volt) is usually selected as the reference potential, a supply voltage of the system usually being constructed as a symmetrical supply with a positive and a negative operating voltage. The voltages of the analog signals accordingly assume a value, which, relative to the reference potential, lie in a positive or an equally large negative range of values.

In order to be able to process such voltages in other systems, particularly in measuring systems, two operating voltages, namely a positive and a negative operating voltage, are also usually provided in these circuit systems. Making these two operating voltages available represents an additional expense, since the two voltages must both be stabilized and screened. Moreover, if the second operating voltage is produced by means of a bootstrap generator, additional disturbances may be caused.

One possibility for avoiding a second operating voltage consists of increasing the reference voltage of the input voltage so that input voltages, below the ground potential, no longer occur. In principle, it would be possible to make available an internally produced reference potential at the input, onto which the analog signal is coupled capacitively. However, such a solution cannot be used for a d.c. voltage or for a low frequency application and thus does not represent a solution to the problem in most cases.

A different solution would consist of connecting a floating d.c. voltage in the input branch of the circuit arrangement. If, for example, a battery were to be used here, the overall size and the absence of long-term stability of this voltage source would be appreciably disadvantageous factors.

SUMMARY OF THE INVENTION

It is therefore an object of the invention to provide a circuit arrangement which, while ensuring a high-resistance and broad band input for the signal voltage, requires only one operating voltage, which is related to the reference potential, and no additional auxiliary voltage.

Pursuant to the invention, there is provided a field effect transistor having a threshold voltage at a noninverting input of an operational amplifier, which is lower than a threshold voltage of a field effect transistor at an inverting input. Moreover, an amount of the difference between the threshold voltages is at least equal to a amount of a value range of an input signal voltage.

With the difference between the threshold voltages, an input offset voltage, with which the signal voltage is raised by the amount of this input offset voltage, is simulated at the operational amplifier. The choice of the amount of the difference between the threshold voltages ensures that the amount of this offset voltage is sufficiently large, so that the signal voltages are in a range which can be processed by the amplifier input, that is, that they are above the reference potential.

A particularly advantageous development of the invention provides that the operational amplifier connected as electrometer amplifier with its output is fed back directly to its inverting input.

With this circuit, an artificial input offset voltage is generated, which results from the difference between the threshold voltages of two MOSFETs.

It is particularly advisable to construct the field effect transistor, which is connected with the noninverting input, as a depletion MOSFET and the field effect transistor, which is connected with the inverting input, as an enhancement MOSFET.

In the event that n-channel MOSFETs are used, an offset voltage of $$U_{offset} = U_{tD} - U_{tE}$$

results, $U_{tD}$ being the threshold voltage of the depletion transistor and $U_{tD}$ the threshold of the enhancement transistor.

DETAILED DESCRIPTION OF THE INVENTION

Figure 1:
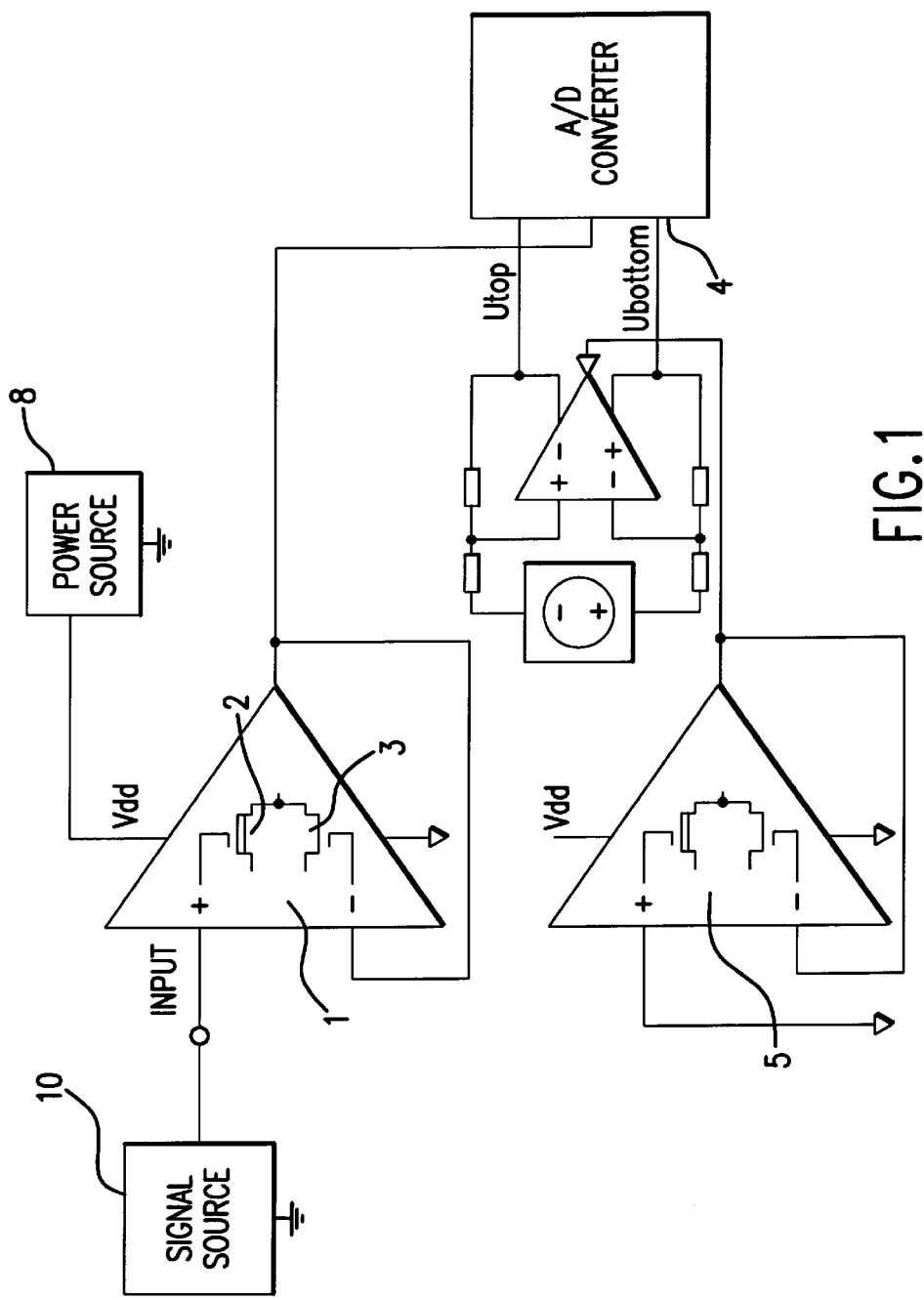
FIG. 1 is a schematic of an embodiment of the present invention.

Referring to FIG. 1, the invention will be described in greater detail in the following by means of an example. FIG. 1 shows a block circuit diagram of an input stage of a CMOS single chip sampling oscilloscope.

This input stage has an operational amplifier 1, connected as an electrometer amplifier. To realize the electrometer amplification function, an output of the operational amplifier 1 is fed back directly to a noninverting input. The input of the operational amplifier 1, is a differential amplifier with two n-channel MOSFETs 2 and 3 of identical layout.

The n-channel MOSFET 2 at the noninverting input of the operational amplifier 1 is constructed as a depletion MOSFET, for which a threshold voltage of about −1.8 V is set in a standard CMOS process. The n-channel MOSFET 3 at the inverting input of the operational amplifier 1 is constructed as an enhancement MOSFET with a threshold of +0.7 V. The difference between the two threshold voltages accordingly is 2.5 V.

The operational amplifier 1 is operated with a power source 8 supplying a voltage $V_{DD}$ of 5 V, relative to a ground potential of 0 V, from a signal source 10, at a signal voltage of 0 V at the input of the operational amplifier 1, the output of the operational amplifier 1 thus is at a voltage of 2.5 V. This output voltage accordingly corresponds to an artificial offset voltage of 2.5 V.

The reference potential of the signal voltage is selected to be equal to the ground potential, that is, 0 V. With the signal offset voltage as set and an appropriate dimensioning of the operating point of the input differential amplifier, it becomes possible, without affecting the linear operating range, to permit a swing of the signal voltage in the value range of ±1

V about the reference voltage of 0 V. This bipolar signal voltage, which is related to zero, is converted with an amplification of 1 by the operational amplifier 1, which is connected as an electrometer, into the range of 1.5 V to 3.5 V and supplied to a flash A/D converter 4.

The so-called body effect, which changes the threshold voltage of MOS transistors, is identical for the two n-channel MOSFETs 2 and 3, since these, as a result of the single-chip variation, are realized on the same substrate. Accordingly, this body effect does not come into play in forming the difference between the threshold voltages.

In order to pick up technologically caused scattering in the artificial offset voltage, a second, identical voltage follower 5, the input of which is at zero, is used in the example shown. Accordingly, its output makes available the internal reference voltage of 2.5 V, which is affected by the same errors as the output voltage of the operational amplifier 1. The reference voltages of the A/D converter $U_{bottom}$ and $U_{top}$ are then made available relative to this voltage. With this, a null-symmetrical signal voltage is always projected, dependent on the technology, in the center of the input voltage range of the A/D converter 4.

Through this circuit arrangement, the CMOS single-chip oscilloscope is realized with a considerable reduction in circuit costs, since the making available of a second operating voltage is avoided, while the accuracy of the measurement, however, remains assured.

I claim:

1. An electrical assembly for analog-signal processing of an input signal outside a power supply range by offsetting an output signal corresponding to said input signal to within said power supply range, comprising:

a power source for supplying a single supply potential and a reference potential which define said power supply range;

an operational amplifier having an output, an inverting input, and supply inputs for accepting said single supply potential and said reference potential;

a signal source producing a varying analog signal voltage having a signal range defined by a positive limit and a negative limit relative to said reference potential wherein one of said positive limit and said negative limit is outside said power supply range;

said operational amplifier having a noninverting input with said varying analog signal voltage coupled thereto as said input signal;

said output being fed back to said inverting input;

said operational amplifier including a differential amplifier having first and second field-effect transistors;

said first field-effect transistor having a gate connected to said noninverting input of said operational amplifier and said second field-effect transistor having a gate connected to said inverting input; and said first field-effect transistor having a threshold voltage U1 different from a threshold voltage U2 of said second field-effect transistor by an offset amount $U_{offset}$ equal to U1–U2 such that a range defined by said offset amount $U_{offset}$ and said reference potential encompasses said one of said positive limit and said negative limit to offset said output signal at said output to within said power supply range for values of said varying analog signal voltage throughout said signal range so that said output signal varies in correspondence with said varying analog signal voltage and within said power supply range.

2. The electrical assembly of claim 1, wherein said operational amplifier is connected as an electrometer amplifier with said output fed back directly to said inverting input.

3. The electrical assembly according to claim 1 wherein said first field-effect transistor is a depletion MOSFET and said second field-effect transistor is an enhancement MOSFET.

4. The amplifier circuit of claim 3, wherein said operational amplifier is connected as a voltage follower with said output fed back directly to said inverting input.

5. An amplifier circuit for analog-signal processing comprising:

an operational amplifier having an output, an inverting input, and supply inputs for accepting a single supply potential and a reference potential which define a power supply range;

said operational amplifier having a noninverting input for accepting a signal voltage of a varying analog signal input thereto which has a signal range including a positive value range and a negative value range relative to said reference potential wherein one of said positive value range and said negative value range are outside said power supply range;

said output being fed back to said inverting input;

said operational amplifier including a differential amplifier having first and second field-effect transistors;

said first field-effect transistor having a gate connected to said noninverting input of said operational amplifier and said second field-effect transistor having a gate connected to said inverting input;

said first field-effect transistor having a threshold voltage lower than a threshold voltage of said second field-effect transistor by an amount at least equal to said one of said positive value range and said negative value range to offset an output signal at said output to within said power supply range for values of said varying analog signal throughout said signal range so that said output signal varies in correspondence with said varying analog signal and within said power supply range; and said first field-effect transistor being a depletion MOSFET and said second field-effect transistor being an enhancement MOSFET.

6. The amplifier circuit of claim 5, wherein said operational amplifier is connected as an electrometer amplifier with said output fed back directly to said inverting input.

7. A method of amplifying an input signal in a form of a varying analog signal varying outside a power supply range by offsetting an output signal corresponding to said input signal to within said power supply range, comprising the steps of:

providing an operational amplifier having an output, a noninverting input, an inverting input, and power inputs;

supplying a single supply potential and a reference potential to said power inputs of said operational amplifier wherein said single supply potential and said reference potential define said power supply range;

applying said varying analog signal to said noninverting input of said operational amplifier, said varying analog signal having a signal range defined by a positive voltage limit and a negative voltage limit relative to said reference potential wherein one of said positive limit and said negative limit is outside said power supply range;

feeding back said output to said inverting input;

including in said operational amplifier a differential amplifier having first and second field-effect transistors;

connecting a gate of said first field-effect transistor to said noninverting input of said operational amplifier and connecting a gate of said second field-effect transistor to said inverting input; and providing said first field-effect transistor with a threshold voltage U1 different from a threshold voltage U2 of said second field-effect transistor by an offset amount $U_{offset}$ equal to U1–U2 such that a range defined by said offset amount $U_{offset}$ and said reference potential encompasses said one of said positive voltage limit and said negative voltage limit to offset said output signal at said output to within said power supply range for values of said varying analog signal throughout said signal range so that said output signal varies in correspondence with said varying analog signal and within said power supply range.

8. The method of claim 7, wherein feeding back said output to said inverting input is done directly so as to form a voltage follower.

9. A method of amplifying a varying analog signal comprising the steps of:

providing an operational amplifier having an output and an inverting input, and supplying a single supply potential and a reference potential to power inputs of said operational amplifier;

applying said varying analog signal input with a positive value range and a negative value range relative to said reference potential to a noninverting input of said operational amplifier;

feeding back said output to said inverting input.

including in said operational amplifier a differential amplifier having first and second field-effect transistors;

connecting a gate of said first field-effect transistor to said noninverting input of said operational amplifier and connecting a gate of said second field-effect transistor to said inverting input;

providing said first field-effect transistor with a threshold voltage lower than a threshold voltage of said second field-effect transistor by an amount at least equal to an amount of a value range of said signal voltage outside a range defined by said single supply potential and said reference potential to offset an output signal at said output to within said range defined by said single supply potential and said reference potential; and said first field-effect transistor being a depletion MOSFET and said second field-effect transistor being an enhancement MOSFET.

10. The method according to claim 7 wherein said first field-effect transistor is a depletion MOSFET and said second field-effect transistor is an enhancement MOSFET.

11. The method according to claim 10, wherein said operational amplifier is connected as a voltage follower with said output fed back directly to said inverting input.

* * * * *